(12) United States Patent
Onodera et al.

(10) Patent No.: US 11,767,399 B2
(45) Date of Patent: Sep. 26, 2023

(54) COMPOSITION, METHOD FOR PRODUCING CONDUCTIVE FILM, CONDUCTIVE FILM, CAPACITOR

(71) Applicant: IDEMITSU KOSAN CO.,LTD., Tokyo (JP)

(72) Inventors: Shingo Onodera, Chiba (JP); Toru Bando, Chiba (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 375 days.

(21) Appl. No.: 17/053,472

(22) PCT Filed: Apr. 18, 2019

(86) PCT No.: PCT/JP2019/016620
§ 371 (c)(1),
(2) Date: Nov. 6, 2020

(87) PCT Pub. No.: WO2019/216155
PCT Pub. Date: Nov. 14, 2019

(65) Prior Publication Data
US 2021/0238350 A1 Aug. 5, 2021

(30) Foreign Application Priority Data
May 8, 2018 (JP) .................. 2018-089830

(51) Int. Cl.
H01B 1/12 (2006.01)
C08G 73/02 (2006.01)
(Continued)

(52) U.S. Cl.
CPC ....... *C08G 73/0266* (2013.01); *C08G 85/004* (2013.01); *C08K 5/13* (2013.01);
(Continued)

(58) Field of Classification Search
CPC ........ C08G 2261/11; C08G 2261/3162; C08G 2261/43; C08G 2261/592;
(Continued)

(56) References Cited

U.S. PATENT DOCUMENTS 5,968,416 A 10/1999 Smith et al.
8,535,812 B2 9/2013 Totsuka et al.
(Continued)

FOREIGN PATENT DOCUMENTS

CN 102482503 A 5/2012
CN 102516784 A 6/2012
(Continued)

OTHER PUBLICATIONS https://web.archive.org/web/20170408002825/https://polymerdatabase.com/polymers/polyvinylbutyral.html (Year: 2017).*
(Continued)

Primary Examiner — Mark Kopec
Assistant Examiner — Jaison P Thomas
(74) Attorney, Agent, or Firm — MILLEN, WHITE, ZELANO & BRANIGAN, PC; Ryan Pool

(57) ABSTRACT

A composition comprising: (a) a conductive polymer, (b) a resin having a solubility parameter of 9.0 to 12.0 (cal/cm$^3$)$^{1/2}$, (c) a solvent, and (d) a phenolic compound.

18 Claims, 1 Drawing Sheet

(51) Int. Cl.
  *C08G 85/00* (2006.01)
  *C08K 5/13* (2006.01)
  *H01G 9/028* (2006.01)
  *C08L 31/04* (2006.01)

(52) U.S. Cl.
  CPC .............. *H01B 1/128* (2013.01); *H01G 9/028* (2013.01); *C08L 31/04* (2013.01)

(58) Field of Classification Search
  CPC .......... C08G 2261/792; C08G 2261/92; C08G 61/12; C08G 73/0266; C08G 85/004; C08J 2379/02; C08J 2429/14; C08L 101/12; C08L 2203/16; C08L 29/14; C08L 31/04; C08L 65/00; C08L 79/02; C09D 165/00; C09D 179/02; C08K 5/13; C08K 5/42; H01B 1/128; H01B 1/20; H01L 51/0035; H01L 51/05; H01G 11/48; H01G 11/56; H01G 9/0036; H01G 9/028
  See application file for complete search history.

(56) References Cited

U.S. PATENT DOCUMENTS

| | | | |
|---|---|---|---|
| 9,384,866 | B2 | 7/2016 | Jibiki et al. |
| 9,754,697 | B2 | 9/2017 | Onodera et al. |
| 10,872,709 | B2 | 12/2020 | Onodera |
| 2018/0057722 | A1 | 3/2018 | Callahan et al. |

FOREIGN PATENT DOCUMENTS

| | | | | | |
|---|---|---|---|---|---|
| CN | 104919005 | A | | 9/2015 | |
| EP | 2476732 | A1 | | 7/2012 | |
| EP | 2942372 | B1 | | 9/2017 | |
| EP | 3168260 | B1 | | 10/2020 | |
| JP | H08-120228 | A | | 5/1996 | |
| JP | 2012062462 | A | | 3/2012 | |
| JP | 2012-151147 | A | | 8/2012 | |
| JP | 2014-132104 | A | | 7/2014 | |
| JP | 2015-034317 | A | | 2/2015 | |
| JP | 2015129220 | A | | 7/2015 | |
| JP | 2017-041361 | A | | 2/2017 | |
| WO | 9222911 | A1 | | 12/1992 | |
| WO | 12102017 | A1 | | 8/2012 | |
| WO | 14106949 | A1 | | 7/2014 | |
| WO | WO-2014106949 | A1 | * | 7/2014 | ......... C23C 18/2066 |
| WO | 2014192287 | A1 | | 12/2014 | |

OTHER PUBLICATIONS

Translation of Written Opinion the International Search Authority PCT/JP2019/016620 dated Nov. 10, 2020 (pp. 1-11).
Office Action in corresponding CN201980030920.9 dated Jan. 10, 2022 (pp. 1-8).
English Translation of PCT/JP2019/016620 dated Jun. 11, 2019.
English Abstract of JPH08-120228, Publication Date: May 14, 1996.
English Abstract of JP2014132104, Publication Date: Jul. 17, 2014.
English Abstract of WO2014192287, Publication Date: Dec. 4, 2014.
English Abstract of JP2017041361, Publication Date: Feb. 23, 2017.
English Abstract of JP2015034317, Publication Date: Feb. 19, 2015.
English Abstract of JP2012151147, Publication Date: Aug. 9, 2012.
English Abstract of CN 102516784, Publication Date: Jun. 27, 2012.
Supplementary EP search report EP19800019 dated Feb. 1, 2022 (pp. 1-4).

* cited by examiner

COMPOSITION, METHOD FOR PRODUCING CONDUCTIVE FILM, CONDUCTIVE FILM, CAPACITOR

TECHNICAL FIELD

The invention relates to a composition, a method for producing a conductive film, a conductive film, and a capacitor.

BACKGROUND ART

A conductive polymer is used as a solid electrolyte for a capacitor, an electromagnetic wave absorbing coating agent, an antistatic coating agent, an undercoating agent for electroplating, conductive ink for circuit wiring or the like.

For example, by using a conductive polymer for a solid electrolyte of a capacitor, a high-performance capacitor with high heat resistance and low electrical resistance can be produced, and such a capacitor has recently been popularized for an in-vehicle application.

Polyaniline, which is a kind of a conductive polymer, has advantages of being relatively easily synthesized from inexpensive aniline and exhibiting excellent stability against oxygen and the like in a conductive state, in addition to its electrical properties, and polyaniline having high conductivity can be easily prepared by, for example, the method described in Patent Document 1.

Various compositions using a conductive polymer have been studied, and for example, Patent Document 2 discloses a conductive composition containing a specific polyaniline and a polymer compound having an acidic group or a salt thereof. In addition, Patent Document 3 discloses a composition for forming an electroless plating undercoat film containing a conductive polymer and a polyvinyl acetal resin.

RELATED ART DOCUMENTS

Patent Documents

[Patent Document 1] WO 2012/102017
[Patent Document 2] JP 2012-62462
[Patent Document 3] WO 2014/192287

SUMMARY OF THE INVENTION

However, the conventional composition has a problem that the heat resistance and moisture resistance of the obtained conductive film are low. It is an object of the invention to provide a composition capable of forming a conductive film excellent in heat resistance and moisture resistance.

According to the invention, the following composition and the like are provided.

1. A composition comprising:
   (a) a conductive polymer,
   (b) a resin having a solubility parameter of 9.0 to 12.0 $(cal/cm^3)^{1/2}$,
   (c) a solvent, and
   (d) a phenolic compound.
2. The composition according to 1, wherein the solubility parameter of the component (b) is 9.5 to 11.0 $(cal/cm^3)^{1/2}$.
3. The composition according to 1 or 2, wherein the amount of the component (b) is 0.1 to 35% by mass based on the amount of the component (a).
4. The composition according to any one of 1 to 3, wherein the component (b) is a polyvinyl acetal resin.
5. The composition according to any one of 1 to 4, wherein the component (a) comprises one or more selected from the group consisting of polyaniline, polyaniline derivatives, polythiophene, polythiophene derivatives, polypyrrole and polypyrrole derivatives.
6. The composition according to any one of 1 to 5, wherein the component (a) is a polyaniline complex comprising polyaniline and a proton donor, and the polyaniline is doped with the proton donor.
7. The composition according to 6, wherein the proton donor is sulfonic acid or sulfonate.
8. The composition according to 7, wherein the sulfonic acid or sulfonate is a sulfosuccinic acid derivative represented by the following formula (III):

$$M(O_3SCH(CH_2COOR^{12})COOR^{13})_m \quad \text{(III)}$$

wherein in the formula (III),
M is a hydrogen atom, an organic free radical or an inorganic free radical,
m is a valence of M,
$R^{12}$ and $R^{13}$ are independently a hydrocarbon group or a group represented by $-(R^{14}O)_r-R^{15}$, $R^{14}$ is a hydrocarbon group or a silylene group, $R^{15}$ is a hydrogen atom, a hydrocarbon group or a group represented by $R^{16}{}_3Si-$, $R^{16}$ is a hydrocarbon group, three $R^{16}$'s may be the same or different, and r is an integer of 1 or more.
9. The composition according to any one of 1 to 8, further comprising one or more selected from the group consisting of (e) an acidic substance and a salt of an acidic substance.
10. The composition according to any one of 1 to 9, further comprising (f) an acid having a hydrophobic group, wherein the hydrophobic group is one or more selected from the group consisting of a linear alkyl group, a branched alkyl group, an alkylphenyl group, and an alkylnaphthyl group.
11. A method for producing a conductive film comprising applying the composition according to any one of 1 to 10, and drying.
12. The method for producing a conductive film according to 11, comprising, after applying the composition and drying, immersing in a solution comprising one or more selected from the group consisting of (e) an acidic substance and a salt of an acidic substance, and drying.
13. A conductive film comprising:
   (a) a conductive polymer, and
   (b) a resin having a solubility parameter of 9.0 to 12.0 $(cal/cm^3)^{1/2}$.
14. The conductive film according to 13, further comprising one or more selected from the group consisting of (e) an acidic substance and a salt of an acidic substance.
15. The conductive film according to 14, comprising two or more kinds of the component (e).
16. A capacitor comprising the conductive film according to any one of 13 to 15.
17. A conductive stacked body comprising:
   a substrate, and
   the conductive film according to any one of 13 to 15 stacked on the substrate.
18. A conductive article obtained by forming the conductive stacked body according to 17.

According to the invention, it is possible to provide a composition capable of forming a conductive film excellent in heat resistance and moisture resistance.

MODE FOR CARRYING OUT THE INVENTION

[Composition]

Figure 1:
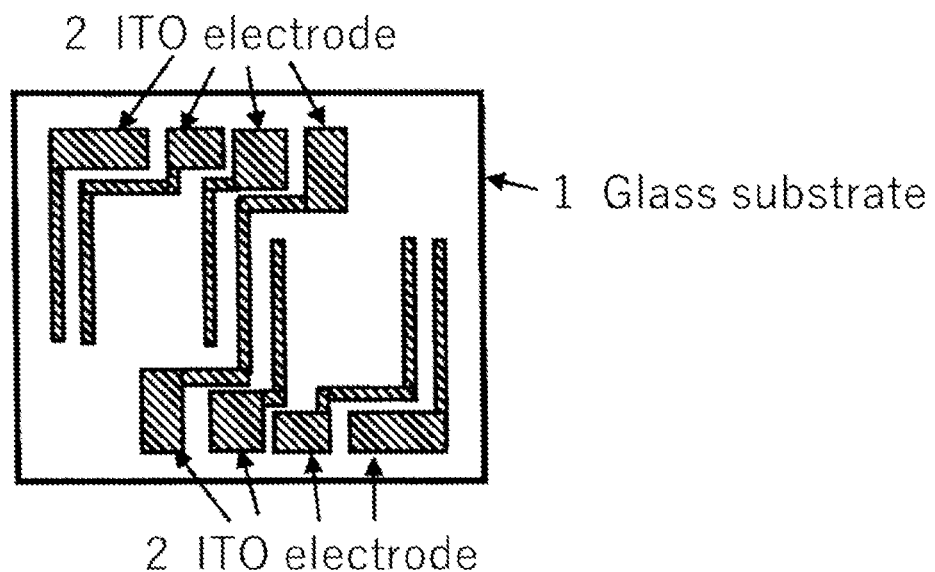
FIG. 1 is a diagram showing the upper surface of the glass substrate on which an indium tin oxide (ITO) electrode is formed on the surface used in Example 1.

A composition according to an aspect of the invention containing: (a) a conductive polymer, (b) a resin having a solubility parameter of 9.0 to 12.0 $(cal/cm^3)^{1/2}$, (c) a solvent, and (d) a phenolic compound. Note that the component represented by each symbol may be simply referred to as a "component (a)" or the like.

By containing a resin (a component (b)) having a specific physical property, the above composition can form a conductive film excellent in both heat resistance and moisture resistance. Specifically, the obtained conductive film has a low increase in resistance value and high stability when left for a long period of time under a high temperature condition or a high moisture condition. Further, the component (b) does not necessarily have to be contained in a large amount, and an effect of improving large heat resistance and moisture resistance can be obtained even in a small amount. In addition, since the above composition contains a component (d), the conductivity of the obtained conductive film can be improved.

Each component will be explained below.
(Component (a): A Conductive Polymer)

Examples of the conductive polymer include polyaniline, polythiophene, polypyrrole, and derivatives thereof. These conductive polymers may or may not have a substituent. These conductive polymers may be used alone or in combination of two or more kinds.

As the conductive polymer, polyaniline is preferred.

The polyaniline preferably has a weight-average molecular weight of 10,000 or more, more preferably 20,000 or more, still more preferably 30,000 or more and 1,000,000 or less, further more preferably 40,000 or more and 1,000,000 or less, and particularly preferably 52,000 or more and 1,000,000 or less.

The weight-average molecular weight of polyaniline is measured by the method described in Examples.

Polyaniline may or may not have a substituent, but is preferably an unsubstituted polyaniline from the viewpoint of versatility and economical efficiency.

Examples of the substituent in the case when polyaniline has a substituent include a linear or branched hydrocarbon group such as a methyl group, an ethyl group, a hexyl group and an octyl group; an alkoxy group such as a methoxy group and an ethoxy group; an aryloxy group such as a phenoxy group; a halogenated hydrocarbon such as a trifluoromethyl group ($—CF_3$ group), etc. can be given.

Further, it is preferable that the conductive polymer be a polyaniline complex in which a proton donor is doped into polyaniline.

The fact that the proton donor is doped into the polyaniline can be confirmed by ultraviolet, visible, near infrared spectroscopy or X-ray photoelectron spectroscopy, and the proton donor can be used without any particular structural limitation as long as the proton donor is sufficiently acidic to generate a carrier in the polyaniline.

The use of the polyaniline complex is preferred because of its improved solubility in a solvent.

Examples of the proton donor include, for example, Bronsted acids, or salts thereof, and is preferably organic acids, or salts thereof (e.g., sulfonic acids or sulfonates), and more preferably proton donors represented by the following formula (I).

$$M(XAR_n)_m \qquad (I)$$

In the formula (I), M is a hydrogen atom, an organic free radical or an inorganic free radical.

Examples of the organic free radical include a pyridinium group, an imidazolium group, an anilinium group, etc., for example. Examples of the inorganic free radicals include sodium, lithium, potassium, cesium, ammonium, etc.

X is an acidic group, such as a group represented by $—SO_3^-$, $—PO_3^{2-}$, $—PO_4(OH)^-$, $—OPO_3^{2-}$, $—OPO_2(OH)^-$, $—COO^-$, and a group represented by $—SO_3^-$ is preferred.

A is a hydrocarbon group which may contain a substituent.

Examples of the hydrocarbon group include, (n+1) valence groups corresponding to, for example, a linear or branched alkyl group including 1 to 24 carbon atoms; an alkenyl group; a cycloalkyl group which may contain a substituent, such as a cyclopentyl, a cyclohexyl, a cycloheptyl, a cyclooctyl, a menthyl; a dicycloalkyl group or a polycycloalkyl group which may be condensed, such as a bicyclohexyl, a norbornyl, an adamantyl; an aryl group containing an aromatic ring which may contain a substituent, such as a phenyl, a tosyl, a thiophenyl, a purrolynyl, a pyridinyl, a furanyl; a diaryl group or polyaryl group which may be condensed, such as a naphthyl, an anthracenyl, a fluorenyl, a 1,2,3,4-tetrahydronaphthyl, an indanyl, a quinolinyl, a indonyl; or an alkylaryl group.

R's are independently a substituent represented by $—R^1$, $—OR^1$, $—COR^1$, $—COOR^1$, $—CO(COR^1)$, or $—CO(COOR^1)$.

$R^1$ is a hydrocarbon group which may contain a substituent including 4 or more carbon atoms, a silyl group, an alkylsilyl group, a group represented by $—(R^2O)_x—R^3$, or a group represented by $—(OSiR^3_2)_x—OR^3$ ($R^2$ is an alkylene group, $R^3$'s are independently a hydrocarbon group which may be the same or different, and x is an integer of 1 or more).

Examples of the hydrocarbon group of $R^1$ include a linear or branched, butyl group, pentyl group, hexyl group, heptyl group, octyl group, nonyl group, decyl group, dodecyl group, pentadecyl group, eicosanil group, and the like.

n is an integer of 2 or more. m is a valence of M.

The organic proton acid represented by the formula (I) or a salt thereof is preferably dialkylbenzenesulfonic acid, dialkylnaphthalenesulfonic acid, sulfophthalic acid ester, or an organic protonic acid represented by the following formula (II) or a salt thereof.

$$M(XCR^4(CR^5_2COOR^6)COOR^7)_p \qquad (II)$$

In the formula (II), M and X are the same as in the formula (I).

p is a valence of M.

$R^4$ and $R^5$ are independently a hydrogen atom, a hydrocarbon group or a group represented by $R^8_3Si—$ (wherein $R^8$ is a hydrocarbon group and the three $R^8$'s may be the same or different).

Examples of the hydrocarbon group of $R^4$ and $R^5$ include a linear or branched alkyl group including 1 to 24 carbon atoms; an aryl group containing an aromatic ring; and an alkylaryl group.

The hydrocarbon group of $R^8$ is the same as the hydrocarbon group of $R^4$ and $R^5$.

$R^6$ and $R^7$ are independently a hydrocarbon group or a group represented by —$(R^9O)_q R^{10}$ [wherein $R^9$ is a hydrocarbon group or a silylen group, $R^{10}$ is a hydrogen atom, a hydrocarbon group, or a group represented by $R^{11}{}_3Si$— ($R^{11}$ is a hydrocarbon group, and three $R^{11}$'s may be the same or different), and q is an integer of 1 or more].

Examples of the hydrocarbon group of $R^6$ and $R^7$ include a linear or branched alkyl group including 1 to 24, preferably 4 or more carbon atoms; an aryl group containing an aromatic ring; and an alkylaryl group.

Specific examples of the hydrocarbon group of $R^6$ and $R^7$ include a linear or branched, butyl group, pentyl group, hexyl group, octyl group, and decyl group.

Examples of the hydrocarbon group of $R^9$ include a linear or branched alkylene group including 1 to 24 carbon atoms; an arylene group containing an aromatic ring; an alkylarylene group; and an arylalkylene group.

Examples of the hydrocarbon group of $R^{10}$ and $R^{11}$ are the same as those of $R^4$ and $R^5$. q is preferably an integer of 1 to 10.

Specific examples of the organic protonic acid or salt thereof represented by the formula (II) when each of $R^6$ and $R^7$ are a group represented by —$(R^9O)_n$—$R^{10}$ include an acid represented by the following formula:

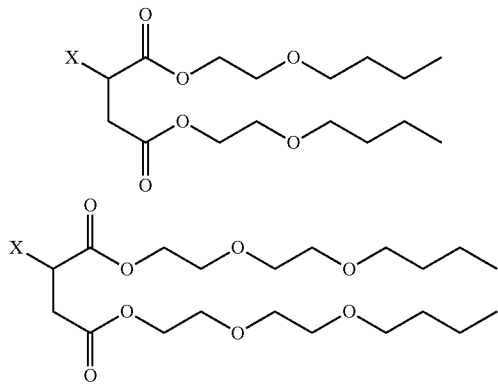

wherein in the formula, X is a group represented by —$SO_3$—.

The compound represented by the formula (II) (a organic protonic acid or a salt thereof) is preferably a sulfosuccinic acid derivative represented by the following formula (III).

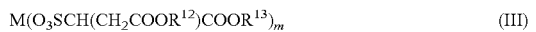

$$M(O_3SCH(CH_2COOR^{12})COOR^{13})_m \quad (III)$$

In the formula (III), M and m are the same as in the formula (I).

$R^{12}$ and $R^{13}$ are independently a hydrocarbon group or a group represented by —$(R^{14}O)_r$—$R^{15}$ [wherein $R^{14}$ is a hydrocarbon group or a silylene group, $R^{15}$ is a hydrogen atom, a hydrocarbon group or a group represented by $R^{16}{}_3Si$— (wherein $R^{16}$ is a hydrocarbon group and three $R^{16}$'s may be the same or different), and r is an integer of 1 or more].

The hydrocarbon group of each of $R^{12}$ and $R^{13}$ are the same as the hydrocarbon group of each of $R^6$ and $R^7$.

The hydrocarbon group of $R^{14}$ is the same as the hydrocarbon group of $R^9$. The hydrocarbon group of each of $R^{15}$ and $R^{16}$ are the same as the hydrocarbon group of each of $R^4$ and $R^5$. r is preferably an integer of 1 to 10.

Specific examples of the organic proton acid or salt thereof represented by the formula (III) when each of $R^{12}$ and $R^{13}$ are a group represented by —$(R^{14}O)_r$—$R^{15}$ is the same as the organic protonic acid or salt thereof represented by the formula (II) when each of $R^6$ and $R^7$ are a group represented by —$(R^9O)_n$—$R^{10}$.

The hydrocarbon group of each of $R^{12}$ and $R^{13}$ are the same as the hydrocarbon group of each of $R^6$ and $R^7$, and are preferably a butyl group, a hexyl group, a 2-ethylhexyl group, a decyl group, and the like.

The doping ratio of the proton donor based on the polyaniline is preferably 0.30 or more and 0.65 or less, more preferably 0.32 or more and 0.60 or less, still more preferably 0.33 or more and 0.57 or less, and particularly preferably 0.34 or more and 0.55 or less. When the doping ratio is 0.30 or more, the solubility of the polyaniline complex in an organic solvent is sufficiently high.

The doping ratio is defined as (the number of moles of the proton donor doped into polyaniline)/(the number of moles of monomer units of polyaniline). For example, the case when a doping ratio of a polyaniline complex containing an unsubstituted polyaniline and a proton donor is 0.5 means that one proton donor is doped for two monomer unit moleculars of polyaniline.

The doping ratio can be calculated if the number of moles of the proton donor and polyaniline monomer units in the polyaniline complex can be measured. For example, when the proton donor is an organic sulfonic acid, the doping ratio can be calculated by determining the number of moles of sulfur atoms derived from a proton donor and the number of moles of the nitrogen atoms derived from a monomer unit of polyaniline, and taking a ratio of these values.

The polyaniline complex preferably contains an unsubstituted polyaniline and a sulfonic acid which is a proton donor, and satisfies the following formula (5):

$$0.32 \leq S_5/N_5 \leq 0.60 \quad (5)$$

wherein in the formula, $S_5$ is the sum of the number of moles of sulfur atoms contained in the polyaniline complex, $N_5$ is the sum of the number of moles of nitrogen atoms contained in the polyaniline complex, and the number of moles of nitrogen atoms and sulfur atoms are the values determined by an organic element analysis.

(Component (b): A Resin Having a Solubility Parameter of 9.0 to 12.0 $(Cal/Cm^3)^{1/2}$)

It is considered that the composition according to an aspect of the invention can suppress the deterioration of the component (a) under high temperature condition and/or high moisture condition by containing the resin having a solubility parameter (hereinafter, sometimes referred to as "a SP value") of 9.0 to 12.0 $(cal/cm^3)^{1/2}$ and can improve the heat resistance and moisture resistance of the conductive film. When the SP value of the component (b) is within the above range, a compatibility with the component (a) is excellent, so that it is possible to sufficiently exhibit the effect of suppressing the deterioration due to the component (b).

For example, in the case where a conductive polymer doped with a proton donor is used as the component (a), it is assumed that the performance of the component (a) itself is deteriorated by de-doping the proton donor under high temperature condition and/or high moisture condition, and it is considered that by containing the component (b), the de-doping can be suppressed, and heat resistance and moisture resistance can be enhanced.

The SP value of the component (b) is preferably 9.5 to 12.0 $(cal/cm^3)^{1/2}$, more preferably 9.5 to 11.0 $(cal/cm^3)^{1/2}$.

The SP value is calculated by Fedors method described in "Polymer Engineering & Science," 1974, Volume 14, pp. 147-154. Specific examples are as described in Examples.

As the component (b), a polymer compound having the above SP value can be used without any particular limitation. Examples of the component (b) include a resin conventionally used as a binder, such as a polyvinyl acetal resin.

The molecular weight of the component (b) is not particularly limited, but is preferably 1,000 to 500,000.

The polyvinyl acetal resin (an acetalized polyvinyl alcohol) is a resin obtained by reacting polyvinyl alcohol (PVA) with aldehydes, and usually has a structure (repeat unit) represented by the following formula (b1).

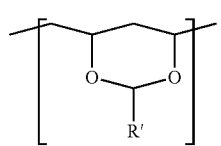

(b1)

In the formula, R' represents a hydrogen atom or a substituent derived from aldehydes.

Examples of R' include an alkyl group, a cycloalkyl group, an allyl group, an aryl group, and the like. Examples of the alkyl group include a methyl, an ethyl, a propyl, an isopropyl, a butyl, an isobutyl, a t-butyl, and the like. Examples of the cycloalkyl group include a cyclopentyl, a cyclohexyl, and the like. Examples of the aryl group include a phenyl, a naphthyl, and the like.

In addition, when PVA is not completely acetalized, for example, as represented by the following formula (b2), a hydroxyl group or an acetyl group may be contained in the molecular structure.

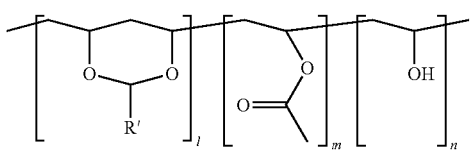

(b2)

In the formula, R' is the same as in the formula (b1). l, m and n represent the abundance ratio (mol %) of each structural unit. Each abundance ratio is, for example, 60 to 80 mol % for l, 0 to 20 mol % for m, and 20 to 40 mol % for n.

Examples of the polyvinyl acetal resin include polyvinyl butyral, polyvinyl acetoacetal, polyvinyl formal, and the like.

Specific examples of the polyvinyl acetal resin include S-REC series (manufactured by SEKISUI CHEMICAL CO., LTD.) such as S-REC B BX-1, S-REC K KS-10, S-REC B BX-L, S-REC K KS-1, S-REC K KS-5Z, S-REC K KS-6Z, S-REC B BH-S, S-REC B BM-S, S-REC B BL-S, S-REC B BL-1, S-REC B BM-2, S-REC B BH-3, S-REC B BX-1, and S-REC B BX-1, and the Mowital series (manufactured by KURARAY CO., LTD.) such as Mowital B16H, B30T, B30H, B60T, B60H.

The added amount of the component (b) is preferably 0.1 to 50% by mass, more preferably 0.1 to 40% by mass, 0.1 to 35% by mass, 0.1 to 25% by mass, 0.1 to 15% by mass, 0.1 to 10% by mass, 0.1 to 5.0% by mass, 1.0 to 15% by mass, or 2.0 to 5.0% by mass, based on the amount of the component (a).

Further, the added amount of the component (b) is preferably 0.1 to 25% by mass, more preferably 0.1 to 16% by mass or less, and may be 0.1% by mass or more and less than 5.0% by mass, 0.1 to 4.0% by mass, or 0.1 to 3.0% by mass, based on the total amount of the component (a) and the component (b).

The composition according to an aspect of the invention highly effective in improving heat resistance and moisture resistance even if the added amount of the component (b) is small. When the added amount of the component (b) is small, the conductivity can be further increased.

(Component (c): A Solvent)

The composition according to an aspect of the invention preferably contains a solvent. The solvent is not particularly limited as long as it dissolves the component (a), but an organic solvent is preferred. The organic solvent may be a water-soluble organic solvent or an organic solvent substantially immiscible with water (water-immiscible organic solvent).

The water-soluble organic solvent may be a protic polar solvent or an aprotic polar solvent, and examples thereof include alcohols such as isopropyl alcohol, 1-butanol, 2-butanol, 2-pentanol, benzyl alcohol, and alkoxy alcohols (e.g., 1-methoxy-2-propanol, 3-methoxy-1-butanol); ketones such as acetone; ethers such as tetrahydrofuran, dioxane, and ethylene glycol mono-tert-butyl ether; aprotic polar solvents such as N-methylpyrrolidone; and the like.

Examples of the water-immiscible organic solvent include hydrocarbon-based solvents such as hexane, benzene, toluene, xylene, ethyl benzene, and tetralin; halogen containing solvents such as methylene chloride, chloroform, carbon tetrachloride, dichloroethane, and tetrachloroethane; ester-based solvents such as ethyl acetate, isobutyl acetate, and n-butyl acetate; ketone-based solvents such as methyl isobutyl ketone (MIBK), methyl ethyl ketone, cyclopentanone, and cyclohexanone; and ether-based solvents such as cyclopentyl methyl ether; and the like. Further, an isoparaffin-based solvent containing one or two or more kinds of isoparaffin-based solvents may be used as the hydrocarbon-based solvent.

Among these, toluene, xylene, methyl isobutyl ketone, chloroform, trichloroethane and ethyl acetate are preferred in terms of excellent solubility of the component (a).

Note that the polyaniline complex among the components (a) can be dissolved even if the solvent is alcohols such as isopropyl alcohol, 1-butanol, 2-butanol, 2-pentanol, benzyl alcohol, or alkoxy alcohol. Alcohol is preferable in the viewpoint of reducing environment burden as compared with an aromatic compound such as toluene.

When an organic solvent is used as a solvent, it is preferable to use a mixed organic solvent in which a water-immiscible organic solvent and a water-soluble organic solvent are mixed in a ratio of 99 to 1:1 to 99 (mass ratio), because the generation of gel or the like during storing can be prevented and can be stored for a long period of time.

As the water-immiscible organic solvent of the above mixed organic solvent, a low-polarity organic solvent can be used, and as the low-polarity organic solvent, hydrocarbon-based solvents such as hexane and toluene; halogen containing solvents such as chloroform; and isoparaffinibased solvent is preferred.

As the water-soluble organic solvent of the mixed organic solvent, a high-polarity organic solvent can be used, and for example, alcohols such as methanol, ethanol, isopropyl alcohol, 2-methoxyethanol, 2-ethoxyethanol, 1-methoxy-2-propanol, and 3-methoxy-1-butanol; ketones such as acetone, methyl ethyl ketone, and methyl isobutyl ketone; and ethers such as tetrahydrofuran, diethyl ether, and ethylene glycol mono-tert-butyl ether are preferred.

The mixed organic solvent may contain one or two or more kinds of water-immiscible organic solvents, and may contain one or two or more kinds of water-soluble organic solvents.

(Component (d): A Phenolic Compound)

The composition according to an aspect of the invention can improve the conductivity of the conductive film by using a phenolic compound.

No specific limitations are imposed on the phenolic compound, and the phenolic compound is a compound represented by ArOH (wherein Ar is an aryl group or a substituted aryl group). Specific examples thereof include phenol; substituted phenols such as o-, m- or p-cresol, o-, m- or p-ethyl phenol, o-, m- or p-propylphenol, o-, m- or p-butylphenol, o-, m- or p-chlorophenol, salicylic acid, hydroxybenzoic acid, hydroxynaphthalene; polyvalent phenolic compounds such as catechol, resorcinol; and polymer compounds such as phenolic resin, polyphenol, poly(hydroxystyrene).

In addition, a phenolic compound represented by the following formula (3) can be used:

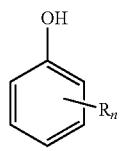

(3)

wherein in the formula, n is an integer of 1 to 5;

R's are independently an alkyl group including 2 to 10 carbon atoms, an alkenyl group including 2 to 20 carbon atoms, an alkylthio group including 1 to 20 carbon atoms, a cycloalkyl group including 3 to 10 carbon atoms, an aryl group including 6 to 20 carbon atoms, an alkylaryl group including 7 to 20 carbon atoms or an arylalkyl group including 7 to 20 carbon atoms.

The above R will be explained below.

Examples of the alkyl group include methyl, ethyl, propyl, isopropyl, butyl, isobutyl, t-butyl, and t-amyl.

Examples of the alkenyl group include a substituent containing an unsaturated bond within the molecule of the above-mentioned alkyl group.

Examples of the cycloalkyl group include cyclopentane, cyclohexane, and the like.

Examples of the alkylthio group include methylthio, ethylthio, and the like.

Examples of the aryl group include phenyl, naphthyl, and the like.

Examples of the alkylaryl group and the arylalkyl group include a substituent obtained by combining the alkyl group and the aryl group mentioned above, and the like.

Among these groups, as R, methyl or ethyl is preferable.

In addition, a phenolic compound represented by the following formula (3') can be used:

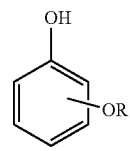

(3')

wherein in the formula, R is an alkyl group including 1 to 20 carbon atoms, an alkenyl group including 2 to 20 carbon atoms, a cycloalkyl group including 3 to 10 carbon atoms, an alkylthio group including 1 to 20 carbon atoms, an aryl group including 6 to 20 carbon atoms, an alkylaryl group including 7 to 20 carbon atoms or an arylalkyl group including 7 to 20 carbon atoms.

Specific examples of R in the formula (3') are the same as R in the formula (3).

The amount of the component (d) is preferably 10 to 5000 parts by mass, more preferably 10 to 2000 parts by mass, based on 100 parts by mass of the component (a).

(Component (e): An Acidic Substance and/or a Salt of an Acidic Substance)

The composition according to an aspect of the invention may contain one or more selected from the group consisting of an acidic substance and a salt of an acidic substance. The component is usually used as a heat-resistant stabilizing agent, and the heat resistance of the conductive film can be further improved.

The acidic substance may be any of an organic acid which is an acid of an organic compound and an inorganic acid which is an acid of an inorganic compound, and is preferably an organic acid. The acidic substance is preferably an organic acid containing one or more sulfonic acid groups.

The organic acid having sulfonic acid groups is preferably a cyclic, linear or branched alkyl sulfonic acid containing one or more sulfonic acid groups, a substituted or unsubstituted aromatic sulfonic acid, or a polysulfonic acid.

Examples of the alkylsulfonic acid include, for example, methane sulfonic acid, ethane sulfonic acid, di-2-ethylhexyl sulfosuccinic acid, and the like. Here, an alkyl group is preferably a linear or branched alkyl group including 1 to 18 carbon atoms.

Examples of the aromatic sulfonic acid include those including 6 to 20 carbon atoms, for example, a sulfonic acid containing a benzene ring, a sulfonic acid having a naphthalene skeleton, and a sulfonic acid having an anthracene skeleton. Further, examples of the aromatic sulfonic acids include a substituted or unsubstituted benzenesulfonic acid, a substituted or unsubstituted naphthalenesulfonic acid, a substituted or unsubstituted anthracenesulfonic acid, and the like.

Examples of the substituent include, for example, a substituent selected from the group consisting of an alkyl group (e.g., including 1 to 20 carbon atoms), an alkoxy group (e.g., including 1 to 20 carbon atoms), a hydroxy group, a nitro group, a carboxy group, and an acyl group, wherein one or more substituents may be substituted.

Specific examples of the aromatic sulfonic acid include a compound represented by the following formula (4) or (5):

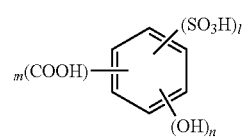

(4)

wherein in the formula (4), is an integer of 1 or more, m is an integer of 0 or more and 5 or less, n is an integer of 0 or more and 5 or less, and when one of m or n is 0, the other is 1 or more;

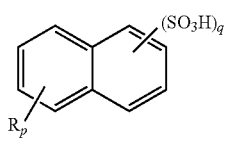

(5)

wherein in the formula (5), q is an integer of 1 or more, p is integer of 0 or more and 7 or less, and R's are independently an alkyl group including 1 to 20 carbon atoms, a carboxyl group, a hydroxyl group, a nitro group, a cyano group, and an amino group.

l is preferably 1 to 3. m is preferably 1 to 3. n is preferably 0 to 3.

q is preferably 1 to 3. p is preferably 0 to 3. R is preferably an alkyl group including 1 to 20 carbon atoms, a carboxy group or a hydroxyl group.

Examples of the aromatic sulfonic acids include 4-sulfophthalic acid, 5-sulfoisophthalic acid, 5-sulfosalicylic acid, 1-naphthalenesulfonic acid, 2-naphthalenesulfonic acid, 2-hydroxy-6-naphthalenesulfonic acid, p-phenolsulfonic acid, toluenesulfonic acid, p-xylene-2-sulfonic acid, 4,4'-biphenyldisulfonic acid, dibenzofuran-2-sulfonic acid, flavianic acid, (+)-10-camphorsulfonic acid, monoisopropylnaphthalenesulfonic acid, 1-pyrenesulfonic acid, and the like. Among these, from the viewpoint of improving heat resistance, 4-sulfophthalic acid, 5-sulfosalicylic acid, 5-sulfoisophthalic acid, 2-naphthalenesulfonic acid, dibenzofuran-2-sulfonic acid, flavianic acid, 2-hydroxy-6-naphthalenesulfonic acid and 1-pyrenesulfonic acid are preferred.

Examples of the salt of the acidic substance include salts of the compounds mentioned above.

Examples of the counter ion of the salt include sodium, lithium, potassium, cesium, ammonium, calcium, barium, and the like.

The component (e) may be a hydrate.

The amount of the component (e) is preferably 0.1 to 1000 parts by mass, more preferably 1 to 100 parts by mass, and still more preferably 1 to 30 parts by mass, based on 100 parts by mass of the component (a).

(Component (f): An Acid Having a Hydrophobic Group)

The composition according to an aspect of the invention may include an acid having a hydrophobic group. The component is usually used as a penetration improver, and the composition can be more penetrated into an object (e.g., a capacitor).

Examples of the hydrophobic group include a linear alkyl group, a branched alkyl group, an alkylphenyl group, and an alkylnaphthyl group. The number of carbon atoms of the alkyl group contained in a linear alkyl group, a branched alkyl group, and an alkylphenyl group and an alkylnaphthyl group is preferably 2 to 20.

Examples of the component (f) include an alkyl carboxylic acid, a phosphoric acid monoester, a phosphoric acid diester, an alkylbenzenecarboxylic acid, and an alkylbenzenephosphonic acid. Note that the alkylbenzenecarboxylic acid is a compound represented by R-Ph-COOH, and the alkylbenzenephosphonic acid is a compound represented by R-Ph-PO(OH)$_2$ (wherein in the formula, R represents an alkyl group, and Ph represents a phenyl group).

The number of carbon atoms of the alkyl group of an alkylcarboxylic acid and alkylbenzenephosphonic acids is preferably from 2 to 20. The phosphoric acid monoester and the phosphoric acid diester are preferably esters obtained from phosphoric acid and an alcohol including 2 to 20 carbon atoms.

Examples of the component (f) specifically include propionic acid, DL-2-methyl butyric acid, 2-methyl valeric acid, 2-ethylhexanoic acid, 3,5,5-trimethylhexanoic acid, myristic acid, monomethyl phosphoric acid, dimethyl phosphoric acid, mixture of monomethyl phosphoric acid and dimethyl phosphoric acid, monoethyl phosphoric acid, diethyl phosphoric acid, mixture of monoethyl phosphoric acid and diethyl phosphoric acid, monoisopropyl phosphoric acid, diisopropyl phosphoric acid, mixture of monoisopropyl phosphoric acid and diisopropyl phosphoric acid, monobutyl phosphoric acid, dibutyl phosphoric acid, mixture of monobutyl phosphoric acid and dibutyl phosphoric acid, mono(2-ethylhexyl) phosphoric acid, di(2-ethylhexyl) phosphoric acid, mixture of mono(2-ethylhexyl) phosphoric acid and di(2-ethylhexyl) phosphoric acid, and the like.

The amount of the component (f) is preferably 20 to 900 parts by mass, more preferably 100 to 500 parts by mass, based on 100 parts by mass of the component (a).

(Component (g): Silica)

The composition according to an aspect of the invention may contain silica. By containing silica, the conductive film having further excellent heat resistance can be formed.

"Silica" means a silicon oxide containing silicon (Si) and oxygen (O), and includes not only compound represented by $SiO_x$ such as $SiO_2$, but also a oligomer or polymer containing a siloxane bond (—O—Si—O—). Further, silica may be a hydrate or an anhydride.

The silica is preferably in a particle form, and may have a structure in which particles are linked in the form of a rosary. The mean particle diameter of the silica particles is preferably 1 to 200 nm. Silica particles in a colloidal state (colloidal silica) may be used.

The mean particle diameter of the silica particles is obtained by calculating the specific surface area by the BET method and converting from the specific surface area. The specific surface area is calculated by the BET method under the conditions described in JIS Z8830 (2013).

Examples of commercially available products of silica include "ORGANOSILICASOL" series ("IPA-ST", "IPA-ST-ZL", "IPA-ST-UP", and the like) and "SNOWTEX" series manufactured by Nissan Chemical Corporation.

The amount of the component (g) is preferably 0.1 to 60 parts by mass, and may be from 0.1 to 40 parts by mass, based on 100 parts by mass of the component (a).

The composition according to an aspect of the invention may consist essentially of one or more components selected from the group consisting of components (a), (b), (c) and (d), and optionally (e) to (g).

In this case, an unavoidable impurity may be contained.

For example, 70% by mass or more, 80% by mass or more, 90% by mass or more, 98% by mass or more, 99% by mass or more, 99.5% by mass or more, 99.9% by mass or more, or 100% by mass of the composition according to an aspect of the invention may be
 components (a) to (d),
 components (a) to (e),
 components (a) to (f), or
 components (a) to (g).

[Conductive Film]

A conductive film can be formed by coating the composition according to an aspect of the invention on a substrate and drying it. The composition may be applied onto a substrate such as a glass, a resin film, a sheet, or a nonwoven fabric having a desired shape to form a conductive stacked body.

The thickness of the conductive film is usually 1 mm or less, preferably 10 nm to 50 µm.

As a method of applying the composition, a known method such as a casting method, a spraying method, a dip coating method, a doctor blade method, a bar coating method, a spin coating method, an electrospinning method, a screen printing, a gravure printing method, or the like can be used.

Further, a step of immersing the conductive film (coating film) in a solution containing the above component (e) and drying may be provided. As the component (e) in this case, a sulfonic acid represented by the formula (4) or a salt thereof is preferred.

The solution for immersing may contain a solvent.

The solvent is not particularly limited as long as the component (e) is dissolved, and examples thereof include water, an alcohol-based solvent, a ketone-based solvent, an ether-based solvent, an ester-based solvent, and the like. These solvents may be used alone or in combination of two or more.

Specific examples of the solvent include methanol, ethanol, isopropanol, n-butanol, 1-methoxy-2-propanol, 3-methoxy-1-butanol, 3-methoxy-3-methyl butanol, 1-ethoxy-2-propanol, ethyl acetate, butyl acetate, MIBK, methyl ethyl ketone (MEK), ethylene glycol mono tert-butyl ether, propylene glycol monomethyl ether acetate, dipropylene glycol monomethyl ether, and the like.

The amount of the component (e) in the immersing solution is preferably 10 to 1200 parts by mass, more preferably 30 to 700 parts by mass, and still more preferably 70 to 400 parts by mass, based on 1 part by mass of the composition obtained by removing the solvent.

If the amount exceeds 1200 parts by mass, an acidic substance may be excessive in a coating film, and as a result, deterioration of the polyaniline main chain may be caused, thereby reducing the conductivity.

Further, the component (e) is preferably 0.1% by mass to 10% by mass, more preferably 0.3% by mass to 6% by mass, and still more preferably 0.7% by mass to 3.5% by mass, in the immersing solution.

As the method for immersion, dipping or the like can be given.

The immersion time is preferably 1 minute or more, more preferably 3 minutes or more and 200 minutes or less. The immersion temperature is preferably 5° C. to 50° C.

It is preferred that drying after the immersion be conducted by using an oven, a hot plate, or the like.

The drying temperature is preferably 80 to 200° C., more preferably 100 to 170° C.

The drying time is preferably 1 to 180 minutes, more preferably 3 to 60 minutes. If necessary, heating may be performed under reduced pressure. The drying temperature and the drying time are not particularly limited, and may be appropriately selected according to the materials used.

As described above, the component (e) may be added in the above composition or may be contained in a conductive film obtained from the composition. The component (e) may be added into the composition, and the component (e) may be also contained in the conductive film obtained from the composition.

In other words, the conductive film according to an aspect of the invention may contain a component (e) added prior to film formation (hereinafter, sometimes referred to as a component (e1)) and a component (e) added after film formation (hereinafter, sometimes referred to as a component (e2)). The components (e1) and (e2) may be the same or different. When the components (e1) and (e2) are different, for example, the component (e1) is a compound represented by the formula (5), and the component (e2) is a compound represented by the formula (4).

The conductive film according to an aspect of the invention contains (a) a conductive polymer and (b) a resin having a solubility parameter of 9.0 to 12.0 $(cal/cm^3)^{1/2}$, and may contain a component (e) as described above (one or more selected from the components (e1) and (e2)).

The conductive film described above may consist essentially of components (a) and (b) and an optional component (e). In this case, an unavoidable impurity may be contained.

For example, 70% by mass or more, 80% by mass or more, 90% by mass or more, 98% by mass or more, 99% by mass or more, 99.5% by mass or more, 99.9% by mass or more, or 100% by mass of the conductive film described above may be
  components (a) and (b), or
  components (a), (b), and (e).

The conductivity of the conductive film described above is preferably 25 S/cm or more, more preferably 50 S/cm or more, and still more preferably 80 S/cm or more.

The conductivity of the conductive film is measured by the method described in Examples.

Note that each component in the conductive film described above are as described in the composition according to an aspect of the invention.

Also, the above-mentioned components (a) to (g) are different from each other.

[Capacitor]

A capacitor can be manufactured using the composition according to an aspect of the invention. Examples of the capacitor specifically include an electrolytic capacitor and an electric double layer capacitor or the like, and examples of the electrolytic capacitor include a solid electrolytic capacitor.

When manufacturing a solid electrolytic capacitor, for example, the process contains the steps of immersing a anode body containing a anode and a dielectric material of the solid electrolytic capacitor with the composition of the invention, and drying to form a conductive film on anode body. That is, the solid electrolytic capacitor contains the conductive film of the invention.

The capacitor according to an aspect of the invention is excellent in heat resistance and moisture resistance, and therefore is extremely useful, for example, when used for an in-vehicle application or a circuit substrate of a communication base station. Vehicles such as automobiles may be placed in a harsh environment of high temperature and high moisture. Further, since the circuit substrate of a communication base station may be heated to a high temperature due to electronic devices such as a power amplifier, the capacitor used in these devices is required to have a predetermined heat resistance and moisture resistance, and the above-mentioned capacitor can satisfy the requirement.

[Conductive Stacked Body, Conductive Article]

A conductive stacked body containing a conductive film can be manufactured by coating the composition according to an aspect of the invention on a substrate such as a glass, a resin film, a sheet, a nonwoven fabric, or the like having a desired shape, and removing a solvent. The conductive stacked body can be processed into a desired shape by a known method such as vacuum molding or pneumatic molding to produce a conductive article. From the viewpoint of molding, a resin film, a sheet or a nonwoven fabric is preferred as the substrate.

As a method for applying the composition to the substrate, a known method such as a casting method, a spraying method, a dip coating method, a doctor blade method, a bar coating method, a spin coating method, an electrospinning method, a screen printing method, and a gravure printing method can be used. When the above coating film is dried, the coating film may be heated depending on the type of solvent. For example, the conductive film is heated at a temperature of 250° C. or less, preferably 50° C. or more and 200° C. or less, under an air stream, and further, if necessary, heated under reduced pressure. The heating temperature and the heating time are not particularly limited, and may be appropriately selected according to the materials used.

It should be noted that the composition according to an aspect of the invention can also be used to manufacture a self-supporting molded body without a substrate.

EXAMPLES

Preparation Example 1 (Preparation of a Polyaniline Complex)

32.4 g of "Neocol SWC" (sodium di-2-ethylhexylsulfosuccinate, manufactured by DKS Co. Ltd.), 13.3 g of aniline, 0.9 g of "Sorbon T-20" (a nonionic emulsifier having a polyoxyethylene sorbitan fatty acid ester structure, manufactured by Toho Chemical Industry Co., Ltd.) was placed in a 1,000 mL separable flask and dissolved by 320.4 g of toluene. 450 g of 17% by mass aqueous solution of a phosphoric acid was added thereto, and the reaction solution having two liquid phases of toluene and water was stirred, and the internal temperature of the reaction solution was cooled to −5° C. When the internal temperature of the reaction solution reached −5° C., while stirring the reaction solution, a solution in which 39.3 g of APS (ammonium persulfate) was dissolved in 90.2 g of 17% by mass aqueous solution of phosphoric acid was dropped over 1 hours using a dropping funnel. After completion of dropping, the solution was further stirred for 8 hours while keeping the internal temperature of the solution at −5° C. (total reaction time of 9 hours). After the stirring was stopped, the contents were transferred to a separatory funnel, and the water phase and the toluene phase were statically separated. After separating, a toluene solution of a polyaniline complex was obtained by washing the toluene phase once with 180.3 g of 8.5% by mass aqueous solution of phosphoric acid, and washing 5 times with 328.0 g of ion-exchanged water. This solution was filtered through a filter paper of No. 2 to remove insoluble content, and a toluene solution of a polyaniline complex soluble in toluene was collected. This solution was transferred to an evaporator, warmed in a water bath at 60° C., and evaporated to remove volatile content by reducing pressure to obtain a polyaniline composite 1 (protonated polyaniline). The weight-average molecular weight of polyaniline of the polyaniline complex 1 was 112,000.

The weight-average molecular weight of polyaniline was measured as follows.

0.25 g of the polyaniline complex was dissolved in 5 g of toluene, and 10 mL of a 1 M aqueous solution of sodium hydroxide was added thereto, and stirred for 15 minutes, followed by suction filtration. The obtained residue was washed 3 times with 10 mL of toluene, 3 times with 10 mL of ion-exchanged water, and 3 times with 10 mL of methanol, and the obtained solid content was dried under reduced pressure, and the weight-average molecular weight of the obtained polyaniline was measured by a gel permeation chromatograph (GPC).

The GPC measurement was performed using GPC column (two "ShodexKF-806M" manufactured by Showa Denko K.K.) under the following measurement conditions.

Solvent: 0.01 M NMP containing LiBr
Flow rate: 0.70 mL/min
Column temperature: 60° C.
Inject volume: 100 μL
UV detection wavelength: 270 nm The weight-average molecular weight obtained by the above method is a polystyrene (PS) equivalent value.

In addition, the doping ratio of the proton donor (sodium di-2-ethylhexylsulfosuccinate) based on polyaniline was 0.36.

Example 1 (Preparation of a Composition)

38 g of isopropyl alcohol, 38 g of tert-amylphenol (Component (d)) and 24 g of hexane were stirred and mixed until uniform to prepare a mixed solvent A. 5.6 g of the polyaniline complex 1 and 0.028 g of "S-LEC B BX-1" (alkyl acetalized polyvinyl alcohol (the compound represented by the formula (b2), l=about 66 mol %, m=3 mol % or less, n=33±3 mol %), manufactured by SEKISUI CHEMICAL CO., LTD., SP value: 10.19, molecular weight: $10.0 \times 10^4$, hereinafter referred to as "S-LEC B BX-1") were dissolved in 94.4 g of the mixed solvent A to obtain a polyaniline complex solution. 0.42 g of 2-naphthalenesulfonic acid hydrate was added to this solution to prepare a composition.

The SP value δ of "S-LEC B BX-1" was calculated by Fedors method described in "Polymer Engineering & Science," 1974, Volume 14, pp. 147-154. Specifically, the calculation was performed using the following formula (A):

$$\delta = \left(\sum_i \Delta e_i / \sum_i \Delta v_i\right)^{1/2} \quad (A)$$

wherein in the formula (A), $\Delta e_i$ represents the aggregation energy density of the functional group in the molecular structure, and $\Delta v_i$ represents the molar molecular weight.

(Production of a Conductive Film)

1 ml of the above-mentioned composition was applied to the upper surface of a glass substrate 1 on which an ITO electrode 2 was formed thereon by patterning shown in FIG. 1. The application was performed by a spin coating method in an atmosphere. The rotating time of the glass substrate 1 after dropping the composition was 15 seconds and the rotating speed of the glass substrate 1 was 2000 rpm. Thereafter, the glass substrate 1 was dried to form a conductive film. The drying temperature was 150° C., and the drying time was 5 minutes.

(Immersing Treatment of the Conductive Film)

0.4 g of 50% by mass of an aqueous solution of 4-sulfophthalic acid (manufactured by Tokyo Chemical Industry Co., Ltd.) was dissolved in 19.6 g of isopropanol (manufactured by Wako Pure Chemical Industries, Ltd.) to obtain a uniform 1% by mass solution of 4-sulfophthalic acid. The above conductive film was immersed in 10 g of this 4-sulfophthalic acid solution for 10 minutes. After immersion, the conductive film was dried for 2 minutes at 30° C., followed by drying at 150° C. for 5 minutes.

(Evaluation of the Conductive Film (Initial Resistance and Conductivity))

Figure 2:
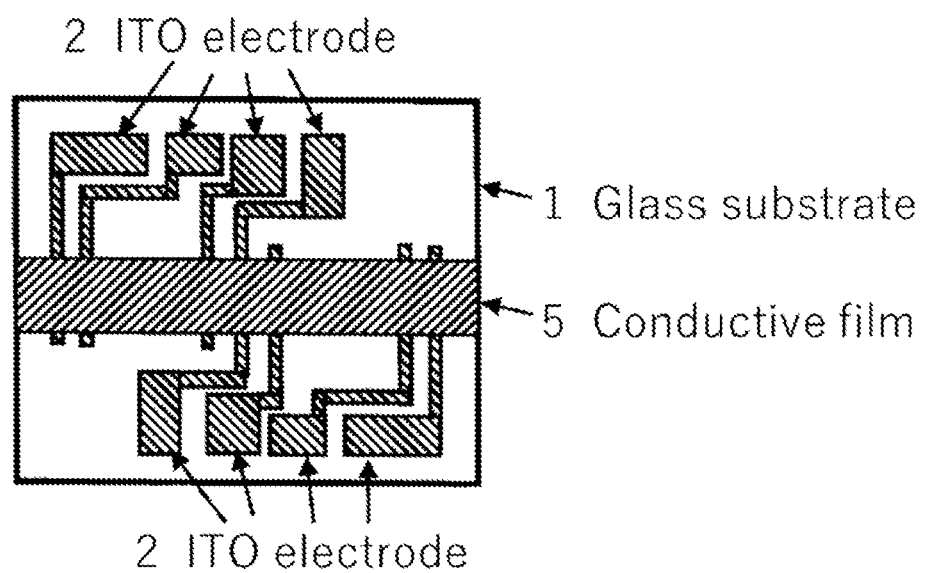
FIG. 2 is a diagram showing the upper surface of the glass substrate prepared in Example 1, in which the conductive film is scraped off to expose the terminal of the ITO electrode to the surface.

As shown in FIG. 2, the portion of the obtained conductive film 5 covering the terminal of the ITO electrode was scraped off under an atmosphere to expose the terminal of the ITO electrode 2 to the surface. Using the ITO electrode 2 exposed on the surface, the resistance (initial resistance R0) and the conductivity of the conductive film was measured by a resistivity meter "Loresta-GP" (manufactured by Mitsubishi Chemicals Corporation) using the four-terminal sensing. The results of conductivity are shown in Table 1.

(Evaluation of the Conductive Film (Heat Resistance))

The conductive film whose initial resistance R0 was measured as described above was left as the glass substrate for a predetermined period of time (the number of elapsed days shown in Table 1) under the conditions of 150° C. in the atmosphere. After the predetermined period of time had elapsed and the temperature of the conductive film back to room temperature, the resistance R was measured in the same manner as the initial resistance R0. The ratio of R to R0 (R/R0) is shown in Table 1. From the ratio (R/R0), the surface resistivity increase rate of the conductive film, i.e. the degree of degradation over time can be obtained.

Example 2

A composition and a conductive film were prepared and evaluated in the same manner as in Example 1, except that the added amount of "S-LEC B BX-1" was changed to 0.056 g. The results are shown in Table 1.

Example 3

A composition and a conductive film were prepared and evaluated in the same manner as in Example 1, except that the added amount of "S-LEC B BX-1" was changed to 0.112 g. The results are shown in Table 1.

Example 4

A composition and a conductive film were prepared and evaluated in the same manner as in Example 1, except that the added amount of "S-LEC B BX-1" was changed to 0.168 g. The results are shown in Table 1.

Example 5

A composition and a conductive film were prepared and evaluated in the same manner as in Example 1, except that the added amount of "S-LEC B BX-1" was changed to 0.28 g. The results are shown in Table 1.

Example 6

A composition and a conductive film were prepared and evaluated in the same manner as in Example 1, except that the added amount of "S-LEC B BX-1" was changed to 0.56 g. The results are shown in Table 1.

Example 7

A composition and a conductive film were prepared and evaluated in the same manner as in Example 1, except that the added amount of "S-LEC B BX-1" was changed to 0.84 g. The results are shown in Table 1.

Example 8

A composition and a conductive film were prepared and evaluated in the same manner as in Example 1, except that the added amount of "S-LEC B BX-1" was changed to 1.12 g. The results are shown in Table 1.

Example 9

A composition and a conductive film were prepared and evaluated in the same manner as in Example 1, except that the added amount of "S-LEC B BX-1" was changed to 1.68 g. The results are shown in Table 1.

Example 10

A composition and a conductive film were prepared and evaluated in the same manner as in Example 1, except that "S-LEC B BX-1" was changed to "S-LEC K KS-10" (alkyl acetalized polyvinyl alcohol (the compound represented by the formula (b2), l=743 mol %, m=3 mol % or less, and n=about 25 mol %), manufactured by SEKISUI CHEMICAL CO., LTD., SP value: 10.25, molecular weight: $1.7 \times 10^4$, hereinafter referred to as "S-LEC K KS-10"), and the added amount was changed to 0.056 g. The results are shown in Table 1.

Example 11

A composition and a conductive film were prepared and evaluated in the same manner as in Example 10, except that the added amount of "S-LEC K KS-10" was changed to 0.112 g. The results are shown in Table 1.

Example 12

A composition and a conductive film were prepared and evaluated in the same manner as in Example 10, except that the added amount of "S-LEC K KS-10" was changed to 0.168 g. The results are shown in Table 1.

Example 13

A composition and a conductive film were prepared and evaluated in the same manner as in Example 10, except that the added amount of "S-LEC K KS-10" was changed to 0.28 g. The results are shown in Table 1.

Example 14

A composition and a conductive film were prepared and evaluated in the same manner as in Example 10, except that the added amount of "S-LEC K KS-10" was changed to 0.56 g. The results are shown in Table 1.

Example 15

A composition and a conductive film were prepared and evaluated in the same manner as in Example 4, except that "S-LEC B BX-1" was changed to "S-LEC B BX-L" (alkyl acetalized polyvinyl alcohol (the compound represented by the formula (b2), l=about 61 mol %, m=3 mol % or less, and n=37±3 mol %), manufactured by SEKISUI CHEMICAL CO., LTD., SP value: 10.29, molecular weight: $1.8 \times 10^4$, hereinafter referred to as "S-LEC B BX-L"). The results are shown in Table 1.

Example 16

A composition and a conductive film were prepared and evaluated in the same manner as in Example 4, except that "S-LEC B BX-1" was changed to "S-LEC K KS-1" (alkyl acetalized polyvinyl alcohol (the compound represented by the formula (b2), l=743 mol %, m=3 mol % or less, and n=about 25 mol %), manufactured by SEKISUI CHEMICAL CO., LTD., SP value: 10.33, molecular weight: $2.7\times 10^4$, hereinafter referred to as "S-LEC K KS-1"). The results are shown in Table 1.

Example 17

A composition and a conductive film were prepared and evaluated in the same manner as in Example 4, except that "S-LEC B BX-1" was changed to "S-LEC K KS-5Z" (alkyl acetalized polyvinyl alcohol (the compound represented by the formula (b2), l=743 mol %, m=3 mol % or less, and n=about 25 mol %), manufactured by SEKISUI CHEMICAL CO., LTD., SP value: 10.41, molecular weight: $13.0\times 10^4$, hereinafter referred to as "S-LEC K KS-5Z"). The results are shown in Table 1.

Example 18

A composition and a conductive film were prepared and evaluated in the same manner as in Example 4, except that "S-LEC B BX-1" was changed to "S-LEC K KS-6Z" (alkyl acetalized polyvinyl alcohol (the compound represented by the formula (b2), l=about 74 mol %, m=3 mol % or less, and n=about 25 mol %), manufactured by SEKISUI CHEMICAL CO., LTD., SP value: 10.25, molecular weight: $10.8\times 10^4$, hereinafter referred to as "S-LEC K KS-6Z"). The results are shown in Table 1.

Example 19

A composition and a conductive film were prepared and evaluated in the same manner as in Example 4, except that "S-LEC B BX-1" was changed to "S-LEC B BH-S" (alkyl acetalized polyvinyl alcohol (the compound represented by the formula (b2), l=73±3 mol %, m=4 to 6 mol %, and n=about 22 mol %), manufactured by SEKISUI CHEMICAL CO., LTD., SP value: 9.91, molecular weight: $6.6\times 10^4$, hereinafter referred to as "S-LEC B BH-S"). The results are shown in Table 1.

Example 20

A composition and a conductive film were prepared and evaluated in the same manner as in Example 4, except that "S-LEC B BX-1" was changed to "S-LEC B BM-S" (alkyl acetalized polyvinyl alcohol (the compound represented by the formula (b2), l=73±3 mol %, m=4 to 6 mol %, and n=about 22 mol %), manufactured by SEKISUI CHEMICAL CO., LTD., SP value: 9.94, molecular weight: $5.3\times 10^4$, hereinafter referred to as "S-LEC B BM-S"). The results are shown in Table 1.

Example 21

A composition and a conductive film were prepared and evaluated in the same manner as in Example 4, except that "S-LEC B BX-1" was changed to "S-LEC B BL-S" (alkyl acetalized polyvinyl alcohol (the compound represented by the formula (b2), l=74±3 mol %, m=3 to 5 mol %, and n=about 22 mol %), manufactured by SEKISUI CHEMICAL CO., LTD., SP value: 9.88, molecular weight: $2.3\times 10^4$, hereinafter referred to as "S-LEC B BL-S"). The results are shown in Table 1.

Example 22

A composition and a conductive film were prepared and evaluated in the same manner as in Example 4, except that "S-LEC B BX-1" was changed to "S-LEC B BL-1" (alkyl acetalized polyvinyl alcohol (the compound represented by the formula (b2), l=63±3 mol %, m=3 mol % or less, and n=about 36 mol %), manufactured by SEKISUI CHEMICAL CO., LTD., SP value: 10.3, molecular weight: $1.9\times 10^4$, hereinafter referred to as "S-LEC B BL-1"). The results are shown in Table 1.

Example 23

A composition and a conductive film were prepared and evaluated in the same manner as in Example 4, except that "S-LEC B BX-1" was changed to "S-LEC B BM-2" (alkyl acetalized polyvinyl alcohol (the compound represented by the formula (b2), l=68±3 mol %, m=3 mol % or less, and n=about 31 mol %), manufactured by SEKISUI CHEMICAL CO., LTD., SP value: 10.12, molecular weight: $5.2\times 10^4$, hereinafter referred to as "S-LEC B BM-2"). The results are shown in Table 1.

Example 24

A composition and a conductive film were prepared and evaluated in the same manner as in Example 4, except that "S-LEC B BX-1" was changed to "S-LEC B BH-3" (alkyl acetalized polyvinyl alcohol (the compound represented by the formula (b2), l=653 mol %, m=3 mol % or less, and n=about 34 mol %), manufactured by SEKISUI CHEMICAL CO., LTD., SP value: 10.2, molecular weight: $11.0\times 10^4$, hereinafter referred to as "S-LEC B BH-3"). The results are shown in Table 1.

Example 25

38 g of isopropyl alcohol, 38 g of 4-isopropylphenol (a component (d)), and 24 g of hexane were stirred and mixed until uniform to prepare a mixed solvent B. 5.6 g of the polyaniline complex 1 and 0.168 g of "S-LEC B BX-1" were dissolved in 94.4 g of the mixed solvent B to obtain a polyaniline complex solution.

0.42 g of 2-naphthalenesulfonic acid hydrate was added to this solution to prepare a composition.

For the obtained composition, a conductive film was prepared and evaluated in the same manner as in Example 1. The results are shown in Table 1.

Example 26

15 g of DL-2-methyl butyric acid, 32 g of isopropyl alcohol, 32 g of p-tert-amylphenol (a component (d)), and 21 g of hexane were stirred and mixed until uniform to prepare a mixed solvent C. 5.6 g of the polyaniline complex 1 and 0.168 g of "S-LEC B BX-1" were dissolved in 94.4 g of the mixed solvent C to obtain a polyaniline complex solution. 0.42 g of 2-naphthalenesulfonic acid hydrate was added to this solution to prepare a composition.

For the obtained composition, a conductive film was prepared and evaluated in the same manner as in Example 1. The results are shown in Table 1.

Comparative Example 1

A composition and a conductive film were prepared and evaluated in the same manner as in Example 1, except that "S-LEC B BX-1" was not added. The results are shown in Table 1.

Comparative Example 2

A composition and a conductive film were prepared and evaluated in the same manner as in Example 25, except that "S-LEC B BX-1" was not added. The results are shown in Table 1.

TABLE 1

| | Component (b) | | Ratio based on the component (a) | Ratio based on the components (a) + (b) | Conductivity of the conductive film (S/cm) | elapsed days | | | | | |
|---|---|---|---|---|---|---|---|---|---|---|---|
| | kind | amount | | | | 1 | 2 | 3 | 4 | 5 | 6 |
| Example 1 | S-LEC B BX-1 | 0.028 g | 0.5% by mass | 0.50% by mass | 245 | — | — | — | 1.6 | — | — |
| Example 2 | S-LEC B BX-1 | 0.056 g | 1.0% by mass | 0.99% by mass | 228 | — | 1.2 | — | — | 1.5 | — |
| Example 3 | S-LEC B BX-1 | 0.112 g | 2.0% by mass | 1.96% by mass | 195 | — | 1.1 | — | — | 1.4 | — |
| Example 4 | S-LEC B BX-1 | 0.168 g | 3.0% by mass | 2.91% by mass | 178 | 1.3 | — | — | — | 1.8 | — |
| Example 5 | S-LEC B BX-1 | 0.28 g | 5.0% by mass | 4.76% by mass | 146 | — | 1.1 | — | — | 1.3 | — |
| Example 6 | S-LEC B BX-1 | 0.56 g | 10.0% by mass | 9.09% by mass | 97 | — | 1.0 | — | — | 1.3 | — |
| Example 7 | S-LEC B BX-1 | 0.84 g | 15.0% by mass | 13.04% by mass | 80 | 0.9 | — | — | 1.2 | — | — |
| Example 8 | S-LEC B BX-1 | 1.12 g | 20.0% by mass | 16.67% by mass | 55 | 0.8 | — | — | — | — | — |
| Example 9 | S-LEC B BX-1 | 1.68 g | 30.0% by mass | 23.08% by mass | 28 | 0.8 | — | — | — | — | — |
| Example 10 | S-LEC K KS-10 | 0.056 g | 1.0% by mass | 0.99% by mass | 213 | — | — | — | 1.4 | — | — |
| Example 11 | S-LEC K KS-10 | 0.112 g | 2.0% by mass | 1.96% by mass | 195 | — | — | — | 1.4 | — | — |
| Example 12 | S-LEC K KS-10 | 0.168 g | 3.0% by mass | 2.91% by mass | 159 | 1.0 | — | — | 1.3 | — | — |
| Example 13 | S-LEC K KS-10 | 0.28 g | 5.0% by mass | 4.76% by mass | 125 | — | 1.1 | — | — | — | — |
| Example 14 | S-LEC K KS-10 | 0.56 g | 10.0% by mass | 9.09% by mass | 87 | — | 0.9 | — | — | — | — |
| Example 15 | S-LEC B BX-L | 0.168 g | 3.0% by mass | 2.91% by mass | 164 | 1.0 | — | — | — | — | — |
| Example 16 | S-LEC K KS-1 | 0.168 g | 3.0% by mass | 2.91% by mass | 190 | 1.1 | — | — | 1.4 | — | — |
| Example 17 | S-LEC K KS-5Z | 0.168 g | 3.0% by mass | 2.91% by mass | 165 | — | — | — | 1.2 | — | — |
| Example 18 | S-LEC K KS-6Z | 0.168 g | 3.0% by mass | 2.91% by mass | 172 | — | — | — | 1.3 | — | — |
| Example 19 | S-LEC B BH-S | 0.168 g | 3.0% by mass | 2.91% by mass | 156 | — | — | — | 1.2 | — | — |
| Example 20 | S-LEC B BM-S | 0.168 g | 3.0% by mass | 2.91% by mass | 162 | — | — | — | 1.4 | — | — |
| Example 21 | S-LEC B BL-S | 0.168 g | 3.0% by mass | 2.91% by mass | 179 | — | — | 1.2 | — | — | 1.6 |
| Example 22 | S-LEC B BL-1 | 0.168 g | 3.0% by mass | 2.91% by mass | 167 | — | — | 1.2 | — | — | 1.4 |
| Example 23 | S-LEC B BM-2 | 0.168 g | 3.0% by mass | 2.91% by mass | 180 | — | — | 1.2 | — | — | 1.5 |
| Example 24 | S-LEC B BH-3 | 0.168 g | 3.0% by mass | 2.91% by mass | 170 | — | 1.0 | — | — | 1.3 | — |
| Example 25 | S-LEC B BX-1 | 0.168 g | 3.0% by mass | 2.91% by mass | 199 | — | — | 1.2 | — | 1.4 | — |
| Example 26 | S-LEC B BX-1 | 0.168 g | 3.0% by mass | 2.91% by mass | 115 | — | — | — | 1.5 | — | — |
| Comp. Ex. 1 | — | — | — | — | 234 | — | 1.5 | — | — | — | 2.0 |
| Comp. Ex. 2 | — | — | — | — | 345 | 1.2 | — | — | — | 1.8 | — |

| | elapsed days | | | | | | | | | | | |
|---|---|---|---|---|---|---|---|---|---|---|---|---|
| | 7 | 8 | 9 | 10 | 11 | 12 | 13 | 14 | 15 | 16 | 17 | 18 | 20 | 21 |
| Example 1 | — | 2.0 | — | 2.5 | | | — | | 2.8 | — | — | | — | — | — | — |
| Example 2 | 1.6 | — | — | — | — | | — | | — | — | 2.8 | — | — | — |
| Example 3 | 1.7 | — | — | — | — | | — | | — | — | 2.8 | — | — | — |

TABLE 1-continued

|  |  |  |  |  |  |  |  |  |  |  |  |  |  |
|---|---|---|---|---|---|---|---|---|---|---|---|---|---|
| Example 4 | — | 2.3 | — | — | — | 2.8 | — | — | 3.5 | — | 4.2 | — | — |
| Example 5 | 1.5 | — | — | — | — | — | — | — | — | 2.4 | — | — | — |
| Example 6 | 1.5 | — | — | — | — | — | — | — | — | 2.2 | — | — | — |
| Example 7 | — | 1.6 | — | — | 1.9 | — | 2.3 | — | — | — | — | — | — |
| Example 8 | — | — | — | 1.5 | — | — | — | — | — | — | 2.2 | — | — |
| Example 9 | — | — | — | 1.5 | — | — | — | — | — | — | 2.6 | — | — |
| Example 10 | 1.8 | — | — | — | 2.1 | — | — | — | 2.7 | — | — | 3.2 | 3.8 |
| Example 11 | 1.7 | — | — | — | 2.1 | — | — | — | 2.9 | — | — | 3.4 | 4.2 |
| Example 12 | — | 1.5 | — | — | 1.7 | — | 1.8 | — | — | — | — | — | — |
| Example 13 | — | — | — | — | 1.7 | — | — | — | — | — | — | 2.8 | — |
| Example 14 | — | — | — | — | 1.6 | — | — | — | — | — | — | 2.4 | — |
| Example 15 | — | — | — | 1.8 | — | — | — | — | — | — | 2.8 | — | — |
| Example 16 | — | 1.7 | — | — | 1.9 | — | 2.1 | — | — | — | — | — | — |
| Example 17 | 1.4 | — | 1.6 | — | — | — | — | — | — | — | — | 2.2 | — |
| Example 18 | 1.5 | — | 1.6 | — | — | — | — | — | — | — | — | 2.3 | — |
| Example 19 | 1.4 | — | 1.5 | — | — | — | — | — | — | — | — | 2.0 | — |
| Example 20 | 1.5 | — | 1.6 | — | — | — | — | — | — | — | — | 3.1 | — |
| Example 21 | — | 1.8 | — | — | — | — | — | — | — | — | 3.3 | — | — |
| Example 22 | — | 1.5 | — | — | — | — | — | — | — | — | 2.3 | — | — |
| Example 23 | — | 1.6 | — | — | — | — | — | — | — | — | 2.6 | — | — |
| Example 24 | 1.4 | — | — | — | — | — | — | — | — | 2.0 | — | — | — |
| Example 25 | — | — | — | — | — | — | — | 2.2 | — | — | — | — | 2.8 |
| Example 26 | 1.9 | — | — | — | 2.3 | — | — | — | 3.0 | — | — | 3.6 | 4.2 |
| Comp. Ex. 1 | — | — | 2.4 | — | — | 3.4 | — | — | 5.0 | 5.7 | — | — | — |
| Comp. Ex. 2 | — | — | 2.4 | — | 3.0 | — | — | — | 4.1 | — | — | — | 6.0 |

| | elapsed days | | | | | | | | | | | | | |
|---|---|---|---|---|---|---|---|---|---|---|---|---|---|---|
| | 22 | 23 | 24 | 25 | 27 | 28 | 29 | 30 | 31 | 32 | 33 | 34 | 35 | 36 |
| Example 1 | 4.7 | — | — | — | — | — | 6.9 | — | — | — | — | — | — | 12 |
| Example 2 | — | 4.2 | — | — | — | — | — | 7.9 | — | — | 9.4 | — | — | — |
| Example 3 | — | 3.9 | — | — | — | — | — | 7.4 | — | — | 8.7 | — | — | — |
| Example 4 | 5.4 | — | — | 6.7 | 7.2 | — | — | — | — | — | — | — | — | 12.0 |
| Example 5 | — | 2.9 | — | — | — | — | — | 5.0 | — | — | 5.7 | — | — | — |
| Example 6 | — | 3.1 | — | — | — | — | — | 5.1 | — | — | 5.9 | — | — | — |
| Example 7 | 3.6 | — | — | — | — | — | 5.1 | — | — | — | — | — | — | 8.2 |
| Example 8 | — | — | 3.3 | — | 3.9 | — | — | — | 4.5 | — | — | — | 5.3 | — |
| Example 9 | — | — | 3.8 | — | 4.3 | — | — | — | 5.0 | — | — | — | 6.2 | — |
| Example 10 | — | — | — | 4.7 | — | — | — | 6.4 | — | — | — | — | — | 8.5 |
| Example 11 | — | — | — | 5.5 | — | — | — | 7.6 | — | — | — | — | — | 10 |
| Example 12 | 2.7 | — | — | — | — | — | 3.7 | — | — | — | — | — | — | 5.6 |
| Example 13 | — | — | — | 3.7 | — | 4.2 | — | — | — | 4.9 | — | — | — | 5.9 |
| Example 14 | — | — | — | 3.7 | — | 4.4 | — | — | — | 5.1 | — | — | — | 6.1 |
| Example 15 | — | — | 4.4 | — | 5.3 | — | — | — | 6.4 | — | — | — | 7.7 | — |
| Example 16 | 3.3 | — | — | — | — | — | 4.4 | — | — | — | — | — | — | 6.7 |
| Example 17 | — | — | — | 3.6 | — | — | — | — | — | 5.2 | — | — | 6.3 | — |
| Example 18 | — | — | — | 3.7 | — | — | — | — | — | 5.3 | — | — | 6.3 | — |
| Example 19 | — | — | — | 3 | — | — | — | — | — | 4.0 | — | — | 4.7 | — |
| Example 20 | — | — | — | 4.7 | — | — | — | — | — | 7.1 | — | — | 8.6 | — |
| Example 21 | — | — | 4.9 | — | — | — | — | — | 7.3 | — | — | 8.9 | — | — |
| Example 22 | — | — | 3.4 | — | — | — | — | — | 4.5 | — | — | 5.3 | — | — |
| Example 23 | — | — | 3.9 | — | — | — | — | — | 5.1 | — | — | 6.0 | — | — |
| Example 24 | — | 2.8 | — | — | — | — | — | 4.4 | — | — | 5.0 | — | — | — |
| Example 25 | — | — | — | — | — | 4.4 | — | — | 5.3 | — | — | — | 6.0 | — |
| Example 26 | — | — | — | 5.2 | — | — | — | 7.0 | — | — | — | — | — | 12 |
| Comp. Ex. 1 | — | 7.3 | — | — | — | — | — | 11 | — | — | 12 | — | 13 | — |
| Comp. Ex. 2 | — | — | — | 11 | — | — | — | 14 | — | — | — | 18 | — | — |

| | elapsed days | | | | | | | | | | | | | |
|---|---|---|---|---|---|---|---|---|---|---|---|---|---|---|
| | 37 | 38 | 39 | 41 | 42 | 43 | 44 | 45 | 46 | 47 | 48 | 49 | 50 | 51 |
| Example 1 | — | — | 14.0 | — | — | 17 | — | — | — | 19 | — | — | 24 | — |
| Example 2 | 12 | — | — | 15 | — | — | 18 | — | — | 24 | — | — | — | — |
| Example 3 | 11 | — | — | 13 | — | — | 16 | — | — | 20 | — | — | — | — |
| Example 4 | — | — | — | — | — | 17 | — | — | — | — | — | — | 31 | — |
| Example 5 | 6.6 | — | — | 7.8 | — | — | 9.3 | — | — | 11 | — | — | — | — |
| Example 6 | 7.2 | — | — | 9.9 | — | — | 12.0 | — | — | 14.0 | — | — | — | — |
| Example 7 | — | — | 9.9 | — | — | 12 | — | — | — | 14 | — | — | 17.0 | — |
| Example 8 | — | 6.1 | — | 7.1 | — | — | — | 8.4 | — | — | — | — | 11 | — |
| Example 9 | — | 7.5 | — | 8.4 | — | — | — | 9.9 | — | — | — | — | 13 | — |
| Example 10 | — | — | 10 | — | — | 13 | — | — | — | — | — | — | 21 | — |
| Example 11 | — | — | 13 | — | — | 16 | — | — | — | — | — | — | 25 | — |
| Example 12 | — | — | 6.2 | — | — | 7.2 | — | — | — | 8.9 | — | — | 11 | — |
| Example 13 | — | — | 6.7 | — | 7.2 | — | — | — | 8.2 | — | — | — | — | — |
| Example 14 | — | — | 7.3 | — | 8.4 | — | — | — | 9.9 | — | — | — | — | — |
| Example 15 | — | 9.3 | — | 11 | — | — | — | 13 | — | — | — | — | 18 | — |
| Example 16 | — | — | 7.6 | — | — | 8.6 | — | — | 11 | — | — | 11 | — | — |
| Example 17 | — | — | 7.0 | — | — | 8.6 | — | — | 10 | — | — | — | 14 | — |

TABLE 1-continued

| | | | | | | | | | | | | | | |
|---|---|---|---|---|---|---|---|---|---|---|---|---|---|---|
| Example 18 | — | — | 7.1 | — | — | 8.8 | — | — | 10 | — | — | — | 14 | — |
| Example 19 | — | — | 5.0 | — | — | 6.1 | — | — | 7.1 | — | — | — | 8.8 | — |
| Example 20 | — | — | 9.7 | — | — | 12 | — | — | 16 | — | — | — | 23 | — |
| Example 21 | — | 9.9 | — | — | 12 | — | — | 15 | — | 17 | — | — | — | — |
| Example 22 | — | 5.7 | — | — | 6.9 | — | — | 8.4 | — | — | 9.2 | — | — | — |
| Example 23 | — | 6.5 | — | — | 7.9 | — | — | 9.5 | — | — | 10 | — | — | — |
| Example 24 | 6.0 | — | — | 7.7 | — | — | 9.1 | — | — | 1.4 | — | — | — | — |
| Example 25 | — | — | 7.5 | — | 8.8 | — | — | 10 | — | — | — | 12 | — | — |
| Example 26 | — | — | 15 | — | — | 19 | — | — | — | — | — | — | 2.8 | — |
| Comp. Ex. 1 | — | — | — | — | — | — | 35 | — | — | — | — | — | — | 60 |
| Comp. Ex. 2 | 23 | — | — | 28 | — | — | 44 | — | — | — | — | — | — | — |

Example 27

5.6 g of the polyaniline complex 1 and 0.056 g of "S-LEC B BX-1" were dissolved in 94.4 g of the mixed solvent A to obtain a polyaniline complex solution. 0.42 g of 2-naphthalenesulfonic acid hydrate was added to this solution to prepare a composition. A conductive film was prepared and evaluated in the same manner as in Example 1, except that (immersing treatment of the conductive film) was not performed. The results are shown in Table 2.

Example 28

A composition and a conductive film prepared and evaluated in the same manner as in Example 27, except that the added amount of "S-LEC B BX-1" was changed to 0.168 g. The results are shown in Table 2.

Comparative Example 3

A composition and a conductive film were prepared and evaluated in the same manner as in Example 27, except that "S-LEC B BX-1" was not added. The results are shown in Table 2.

Example 29

5.6 g of the polyaniline complex 1 and 0.168 g of "S-LEC B BX-1" were dissolved in 94.4 g of the mixed solvent B to obtain a polyaniline complex solution. Using the obtained composition, a conductive film was prepared and evaluated in the same manner as in Example 1. The results are shown in Table 2.

Example 30

A composition and a conductive film were prepared and evaluated in the same manner as in Example 29, except that "S-LEC B BX-1" was changed to "S-LEC K KS-10". The results are shown in Table 2.

Comparative Example 4

A composition and a conductive film were prepared and evaluated in the same manner as in Example 29, except that "S-LEC B BX-1" was not added. The results are shown in Table 2.

TABLE 2

| | Component (b) | | Ratio based on the component (a) | Ratio based on the components (a) + (b) | Conductivity of the conductive film (S/cm) | elapsed days | | | |
|---|---|---|---|---|---|---|---|---|---|
| | kind | amount | | | | 1 | 2 | 5 | 8 |
| Example 27 | S-LEC B BX-1 | 0.056 g | 1.0% by mass | 0.99% by mass | 70 | — | 2.0 | 12 | — |
| Example 28 | S-LEC B BX-1 | 0.168 g | 3.0% by mass | 2.91% by mass | 60 | — | 1.9 | 8.6 | — |
| Comp. Ex. 3 | — | — | — | — | 82 | — | 2.8 | 20.0 | — |
| Example 29 | S-LEC B BX-1 | 0.168 g | 3.0% by mass | 2.91% by mass | 121 | 1.3 | — | 1.9 | 2.3 |
| Example 30 | S-LEC K KS-10 | 0.168 g | 3.0% by mass | 2.91% by mass | 130 | 1.1 | — | 1.7 | 2.0 |
| Comp. Ex. 4 | — | — | — | — | 188 | 1.2 | — | 1.9 | 2.4 |

| | elapsed days | | | | | | | | |
|---|---|---|---|---|---|---|---|---|---|
| | 9 | 11 | 12 | 14 | 15 | 20 | 23 | 29 | 33 | 43 |
| Example 27 | 59.5 | — | 254 | 475 | — | — | 25934 | — | — | — |
| Example 28 | 42.7 | — | 109 | 179 | — | — | 11637 | — | — | — |
| Comp. Ex. 3 | 69.1 | — | 270 | 510 | — | — | 29459 | — | — | — |
| Example 29 | — | 3.0 | — | — | 4.1 | 5.7 | — | 9.5 | 11.0 | 31.8 |
| Example 30 | — | 2.4 | — | — | 3.1 | 4.1 | — | 7.6 | 9.8 | 22.8 |
| Comp. Ex. 4 | — | 3.0 | — | — | 4.2 | 6.6 | — | 14.2 | 18.5 | 64.8 |

Example 31

2.8 g of the polyaniline complex 1 and 0.084 g of "S-LEC B BX-1" were dissolved in 94.4 g of the mixed solvent A to obtain a polyaniline complex solution. 0.21 g of 2-naphthalenesulfonic acid hydrate was added to this solution to prepare a composition.

Using the obtained composition, a conductive film was prepared in the same manner as in Example 1, except that a glass substrate on which an ITO electrode was not formed on the surface was used and the rotation speed of the glass substrate was 2500 rpm. In addition, the same treatment as that of Example 1 (immersing treatment of the conductive film) was performed. The surface resistance (initial surface resistance R'0) of the obtained conductive film was measured by a resistivity meter "Loresta-GP" (manufactured by Mitsubishi Chemicals Corporation) using the four-terminal sensing.

Further, using the composition obtained above, the conductivity of the conductive film was evaluated by performing the same operation as in Example 1. The results of conductivity are shown in Table 3.

(Evaluation of Conductive Film (Moisture Resistance Test))

The conductive film whose initial surface resistance R'0 was measured as described above was left as the glass substrate for a predetermined period of time (the number of elapsed days shown in Table 1) under the conditions of 85° C. and 85% RH in the atmosphere. After the predetermined period of time had elapsed and the temperature of the conductive film back to room temperature, the surface resistance R' was measured in the same manner as the initial surface resistance R'0. The ratio of R' to R'0 (R'/R'0) is shown in Table 3. From the ratio (R'/R'0), the surface resistivity increase rate of the conductive film, i.e. the degree of degradation over time can be obtained.

Example 32

A composition and a conductive film were prepared and evaluated in the same manner as in Example 31, except that "S-LEC B BX-1" was changed to "S-LEC B BL-1". The results are shown in Table 3.

Example 33

A composition and a conductive film were prepared and evaluated in the same manner as in Example 31, except that "S-LEC B BX-1" was changed to "S-LEC K KS-10". The results are shown in Table 3.

Example 34

A composition and a conductive film were prepared and evaluated in the same manner as in Example 31, except that "S-LEC B BX-1" was changed to "S-LEC B BX-L". The results are shown in Table 3.

Example 35

A composition and a conductive film were prepared and evaluated in the same manner as in Example 31, except that "S-LEC B BX-1" was changed to "S-LEC B BH-3". The results are shown in Table 3.

Example 36

A composition and a conductive film were prepared and evaluated in the same manner as in Example 31, except that "S-LEC B BX-1" was changed to "S-LEC K KS-5Z". The results are shown in Table 3.

Comparative Example 5

A composition and a conductive film were prepared and evaluated in the same manner as in Example 31, except that "S-LEC B BX-1" was not added. The results are shown in Table 3.

TABLE 3

| | Component (b) | | | | Conductivity of the conductive film (S/cm) | elapsed days | | | | | |
|---|---|---|---|---|---|---|---|---|---|---|---|
| | kind | amount | Ratio based on the component (a) | Ratio based on the components (a) + (b) | | 4 | 7 | 8 | 10 | 14 | 18 |
| Example 31 | S-LEC B BX-1 | 0.084 g | 3.0% by mass | 2.91% by mass | 178 | — | — | — | 1.2 | 1.4 | 2.0 |
| Example 32 | S-LEC B BL-1 | 0.084 g | 3.0% by mass | 2.91% by mass | 159 | — | — | — | 0.9 | 1.1 | 1.5 |
| Example 33 | S-LEC K KS-10 | 0.084 g | 3.0% by mass | 2.91% by mass | 167 | — | — | — | 0.9 | 1.1 | 1.3 |
| Example 34 | S-LEC B BX-L | 0.084 g | 3.0% by mass | 2.91% by mass | 164 | 0.9 | — | 1.1 | — | — | 2.0 |
| Example 35 | S-LEC B BH-3 | 0.084 g | 3.0% by mass | 2.91% by mass | 170 | 0.9 | — | 1.2 | — | — | 1.9 |
| Example 36 | S-LEC K KS-5Z | 0.084 g | 3.0% by mass | 2.91% by mass | 165 | 0.9 | — | 1.2 | — | — | 2.4 |
| Comp. Ex. 5 | — | — | — | — | 234 | — | 2.3 | — | — | — | — |

| | elapsed days | | | | | | | | | | |
|---|---|---|---|---|---|---|---|---|---|---|---|
| | 21 | 24 | 28 | 31 | 34 | 37 | 38 | 42 | 45 | 46 | 47 |
| Example 31 | — | — | 2.3 | — | 4.6 | — | — | 7.7 | — | — | 14.2 |
| Example 32 | — | — | 2.9 | — | 3.6 | — | — | 5.5 | — | — | 8.7 |
| Example 33 | — | — | 2.2 | — | 3.4 | — | — | 6.2 | — | — | 10.3 |
| Example 34 | — | 2.9 | — | 5.1 | — | 8.1 | — | — | — | 19.2 | — |
| Example 35 | — | 2.6 | — | 4.7 | — | 8.2 | — | — | — | 18.5 | — |
| Example 36 | — | 2.9 | — | 5.1 | — | 6.8 | — | — | — | — | — |
| Comp. Ex. 5 | 5.8 | — | — | 14.0 | — | — | 23.9 | — | 30.0 | — | — |

From the above Examples, it can be seen that a conductive film excellent in heat resistance and moisture resistance can be produced by the composition according to an aspect of the invention. When such a conductive film is used for a capacitor, for example, heat resistance and moisture resistance of the capacitor itself are improved, so that such a capacitor is extremely useful, for example, when used for an in-vehicle application or a circuit substrate of a communication base station.

Industrial Applicability

The composition of the invention can be used in the fields of power electronics and optoelectronics as an electrostatic and antistatic material, a transparent electrode and a conductive film material, a material of an electroluminescent device, a circuit material, an electromagnetic wave shielding material, a dielectric and an electrolyte of a capacitor, an electrode material of a solar cell and a secondary cell, a fuel cell separator material, etc., or as a plating base, a rust inhibitor, etc.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. A composition comprising:
   (a) a conductive polymer,
   (b) a resin having a solubility parameter of 9.0 to 12.0 $(cal/cm^3)^{1/2}$,
   (c) a solvent, and
   (d) a phenolic compound;
   wherein the amount of the component (b) based on the amount of the component (a) is 0.1% by mass or more and less than 30% by mass.

2. The composition according to claim 1, wherein the solubility parameter of the component (b) is 9.5 to 11.0 $(cal/cm^3)^{1/2}$.

3. The composition according to claim 1, wherein the amount of the component (b) is 0.1 to 25% by mass based on the amount of the component (a).

4. The composition according to claim 1, wherein the component (b) is a polyvinyl acetal resin.

5. The composition according to claim 1, wherein the component (a) comprises one or more selected from the group consisting of polyaniline, polyaniline derivatives, polythiophene, polythiophene derivatives, polypyrrole and polypyrrole derivatives.

6. The composition according to claim 1, wherein the component (a) is a polyaniline complex comprising polyaniline and a proton donor, and the polyaniline is doped with the proton donor.

7. The composition according to claim 6, wherein the proton donor is sulfonic acid or sulfonate.

8. The composition according to claim 7, wherein the sulfonic acid or sulfonate is a sulfosuccinic acid derivative represented by the following formula (III):

$$M(O_3SCH(CH_2COOR^{12})COOR^{13})_m \quad (III)$$

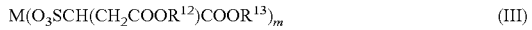

wherein in the formula (III),
M is a hydrogen atom, an organic free radical or an inorganic free radical,
m is a valence of M,
$R^{12}$ and $R^{13}$ are independently a hydrocarbon group or a group represented by $—(R^{14}O)_r—R^{15}$, $R^{14}$ is a hydrocarbon group or a silylene group, $R^{15}$ is a hydrogen atom, a hydrocarbon group or a group represented by $R^{16}_3Si—$, $R^{16}$ is a hydrocarbon group, three $R^{16}$'s may be the same or different, and r is an integer of 1 or more.

9. The composition according to claim 1, further comprising one or more selected from the group consisting of (e) an acidic substance and a salt of an acidic substance.

10. The composition according to claim 1, further comprising (f) an acid having a hydrophobic group, wherein the hydrophobic group is one or more selected from the group consisting of a linear alkyl group, a branched alkyl group, an alkylphenyl group, and an alkylnaphthyl group.

11. A method for producing a conductive film comprising applying the composition according to claim 1, and drying.

12. The method for producing a conductive film according to claim 11, comprising, after applying the composition and drying, immersing in a solution comprising one or more selected from the group consisting of (e) an acidic substance and a salt of an acidic substance, and drying.

13. A conductive film comprising:
   (a) a conductive polymer, and
   (b) a resin having a solubility parameter of 9.0 to 12.0 $(cal/cm^3)^{1/2}$;
   wherein the amount of the component (b) based on the amount of the component (a) is 0.1% by mass or more and less than 30% by mass.

14. The conductive film according to claim 13, further comprising one or more selected from the group consisting of (e) an acidic substance and a salt of an acidic substance.

15. The conductive film according to claim 14, comprising two or more kinds of the component (e).

16. A capacitor comprising the conductive film according to claim 13.

17. A conductive stacked body comprising:
   a substrate, and
   the conductive film according to claim 13 stacked on the substrate.

18. A conductive article obtained by forming the conductive stacked body according to claim 17.

* * * * *